United States Patent [19]

Lin et al.

[11] Patent Number: 5,043,985
[45] Date of Patent: Aug. 27, 1991

[54] INTEGRATED CIRCUIT TESTING ARRANGEMENT

[75] Inventors: Jing-Yuan Lin; Wen-Der Lian, both of Hsin Chu, Taiwan

[73] Assignee: Industrial Technology Research Institute, Hsin Chu, Taiwan

[21] Appl. No.: 46,254

[22] Filed: May 5, 1987

[51] Int. Cl.⁵ .............................................. G01R 31/28
[52] U.S. Cl. .................................. 371/22.3; 371/22.5
[58] Field of Search ................. 324/73 R; 371/25, 20, 371/15, 22.3, 22.5

[56] References Cited

U.S. PATENT DOCUMENTS

| | | | |
|---|---|---|---|
| 4,340,857 | 7/1982 | Fasang | 324/73 R |
| 4,357,703 | 11/1982 | Van Brent | 371/22.5 |
| 4,377,757 | 3/1983 | Könemann et al. | 307/303 |
| 4,594,711 | 6/1986 | Thatte | 371/25 |
| 4,597,080 | 6/1986 | Thatte et al. | 371/25 |
| 4,701,916 | 10/1987 | Naven et al. | 371/25 |
| 4,701,920 | 10/1987 | Resnick et al. | 371/225 |
| 4,703,484 | 10/1987 | Rolfe et al. | 371/25 |

*Primary Examiner*—Stephen M. Baker
*Attorney, Agent, or Firm*—Darby & Darby

[57] ABSTRACT

A circuit and system enabling testing and development of IC circuits having µ-ROM circuits of the equivalent. A test circuit has a plurality of stages, each connected to receive and output a separate signal from the µ-ROM, in normal operation. The stages are controlled by a mode signal, in a test mode, to pass signals serially between the stages from a test pin to a scan out pin, as well as to output signals to the separate stage outputs. The test mode is initiated by the coincidence of a synchronization pulse and a given logic level at the test pin.

9 Claims, 5 Drawing Sheets

INTEGRATED CIRCUIT TESTING ARRANGEMENT

This invention relates to a system for testing Integrated Circuits, and is more in particular directed to the provision of a circuit, which may be an on chip circuit, that enables the rapid and accurate quality testing of an Integrated Circuit. The circuit and system disclosed herein also provides additional advantages within the scope of the invention, such as readily adapting a chip encorporating the circuit of the invention to device and program development.

The use of complex integrated logic circuits is well known, as is the need to enable testing of such circuits for quality control purposes as well as for research and development of IC chips encorporating such circuits.

A typical calculator circuit, as illustrated in FIG. 1, is comprised of a $\mu$-ROM circuit 100 including logic and instruction circuitry, a control circuit 101 receiving instruction outputs from the $\mu$-ROM and applying determined outputs back to the $\mu$-ROM, a keyboard 102 for entering data into the calculator by way of the $\mu$-ROM, and a display, such as LCD display 103, for displaying the results of a mathematical operation or the like.

In order to quality test a circuit such as shown in FIG. 1, is is conventional to merely simulate the process employed by the user. Thus, as illustrated in FIG. 2 as an example of determining whether the device correctly adds 1 and 2, the procedure 1+2= is entered into the keyboard in conventional fashion in blocks 110-113. The circuit, responsive to the = command, executes the procedure at block 114 and displays the result at block 115. This technique for testing has many disadvantages, such as:

1. A time delay occurs as a result of using keyboard input not only due to the required time for manual input, but also due to the required debounce time to insure a valid signal.
2. Repetition occurs for many of the processes of the device, since the same routines are repeatedly executed, although during the application of different keys.
3. Some test procedures are not applicable to general cases, e.g. a test of 1+2 may not validly test the procedure 2+1.

Traditional quality testing by effecting the function tests in conventional manner is thus time-consuming, may result in incomplete testing, and generally cannot test completely for faults that may occur.

Various IC testing arrangements, some of which may include on-chip test circuits, are disclosed in U.S. Pat. Nos. 4,493,077; 4,176,258; 4,357,703; 4,433,413; 4,493,078; 4,504,784; 4,510,603; 4,534,028; 4,404,519; 4,450,560; 4,527,234 and 4,267,463. These circuits are generally complex in circuitry and/or operation.

The present invention is therefor directed to the provision of an improved circuit and system for checking the operation of $\mu$-ROM and equivalent IC circuits, such as logic and calculator circuit, that is accurate and rapid and that requires a minimum of expense.

Briefly stated, in accordance with one embodiment of the invention, a testing circuit is comprised of a plurality of stages each adapted to receive a separate output from a $\mu$-ROM or similar circuit, and each adapted to output the signal received thereby. The circuit further comprises a test input terminal, and a latch circuit coupled thereto. The latch is set to one state upon coincidence of a synchronizing pulse and a high logic state at the test input, and is set to another logic state upon the coincidence of the synchronizing pulse and a low logic state at the test input. Each stage incorporates means, such as selectors, responsive to the state of the latch, for directing signals therethrough, so that in one (i.e. normal) state of the latch the data input signals of each stage are directed to the data outputs of the respective stage.

In addition, the stages are adapted to be interconnected serially between a test input terminal and a scan output terminal, so that, during a test procedure, test signals may be shifted through the stages from the test input to the scan output.

The arrangement of the invention thus enables the simple introduction of the test procedure, by the application of a given signal level at the test input during a synchronization signal, and the simple application of the test signals serially to the device.

In order that the invention may be more clearly understood, it will now be disclosed in greater detail with reference to the accompanying drawings, wherein.

Figure 1:
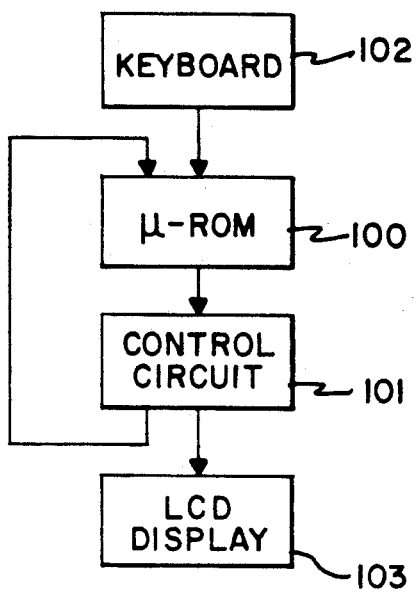
FIG. 1 is a simplified block diagram of a known system, for example for a four function calculator.
Figure 2:
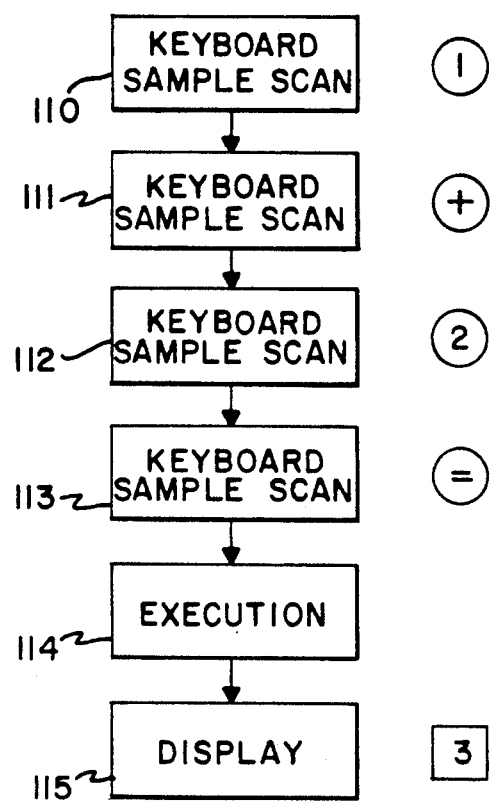
FIG. 2 is a flow diagram illustrating a testing technique for the system of FIG. 1.
Figure 3:
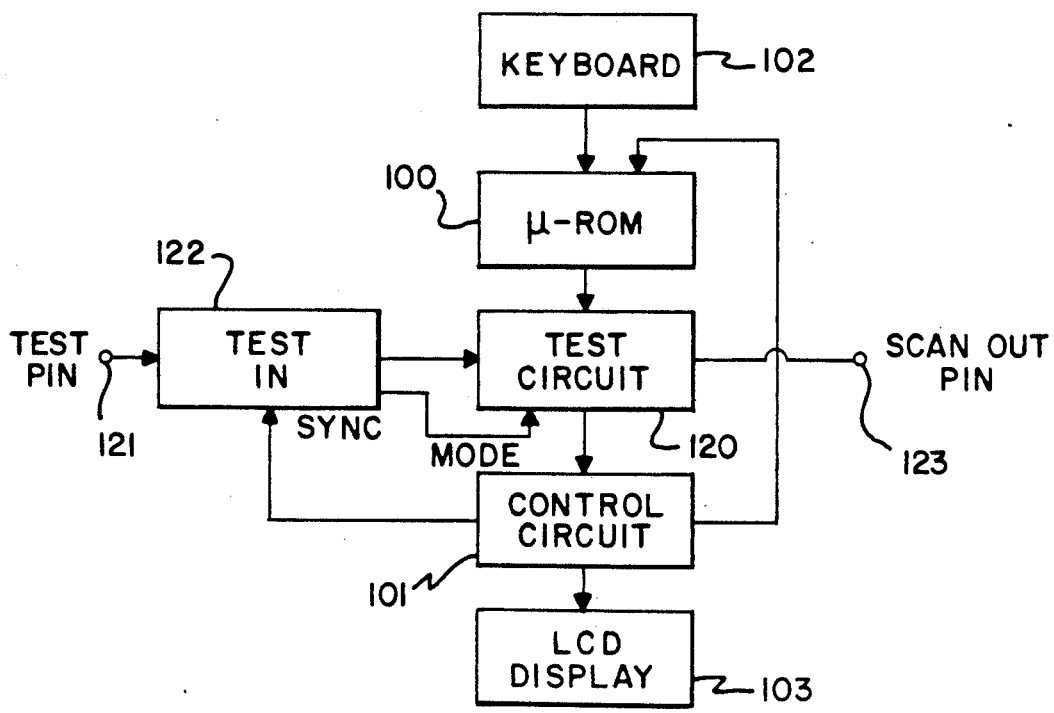
FIG. 3 is a simplified block diagram of one embodiment of a system in accordance with the invention.

Referring now to the drawings, and more in particular to FIG. 3, therein is illustrated a modification of the basic system of FIG. 1, encorporating a test circuit in accordance with the invention. In this arrangement, the outputs of the $\mu$-ROM 100 are applied to a test circuit 120, the test circuit 120 having outputs connected to the control circuit 101, so that in normal operation the test circuit does not modify the signals passing from the $\mu$-ROM circuit to the control circuit.

As illustrated in FIG. 3, a test input pin 121 is coupled to the test circuit 120 by way of a TEST IN circuit 122, the outputs of the TEST IN circuit applying data and mode signals to the test circuit. The TEST IN circuit is illustrated as controlled by the control circuit 101. The TEST IN circuit continually applies signals at the pin 121 to the test circuit 120, but only applies a mode signal thereto in response to the coincidence of a synchronization pulse or signal and a given (e.g. high) level at the test pin. Upon such coincidence, the mode signal output of the TEST IN circuit changes the mode of the test circuit 120, to serially step subsequent serial signals at the test pin 121 through the stages of the test circuit 120, and thence to the SCAN OUT pin 123. As will be seen in the following paragraphs, the most recent $\mu$-ROM data that had been applied earlier to the test circuit, in parallel, remains stored in the stages of the test circuit, and is consequently also stepped through the stages to the SCAN OUT pin 123. As the serial test signals are stepped through the test circuit, they are also serially applied via the outputs of the test circuit to the control circuit 101.

Figure 4:
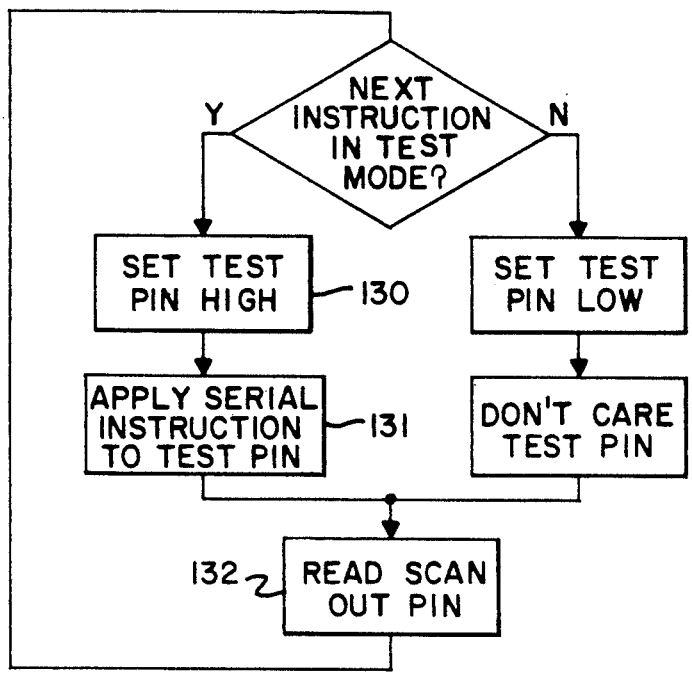
FIG. 4 is a flow diagram illustrating the testing of a circuit in accordance with the invention.

As illustrated in FIG. 4, the testing of the μ-ROM circuit and control circuit can be effected, in accordance with the invention, by setting the test pin 121 to a given level (preferably a logic high level) at the time of occurence of the synchronization pulse, at block 130, and then applying serial test signals to the test pin, at block 131. The SCAN OUT pin 123 is then read, at block 132. The response of the circuit, as determined by the signals at the SCAN OUT pin 123, test pin was set low at the time of occurence of the synchronization pulse, however, as illustrated in FIG. 4, the signals at the SCAN OUT pin are not responsive to the serial test signals. Since the test signals are applied directly to the circuit, the disadvantages of prior circuits in requiring keyboard entry are overcome, and the testing procedure may thus be more complete and more accurate, and be effected in a shorter time. In addition, only minimum external control is necessary, since the mode change is effected by the relative timing of the mode change level at the test pin, with respect to the synchronization pulse.

The synchronization signal may be produced by any conventional manner, for example as a part of the timing of the control circuit, and is preferably at a rate to permit stepping of an input signal through all of the stages of the test circuit before repetition. As will be seen, the device in accordance with the invention enables testing of the μ-ROM circuit as well as the control circuit.

Figure 5:
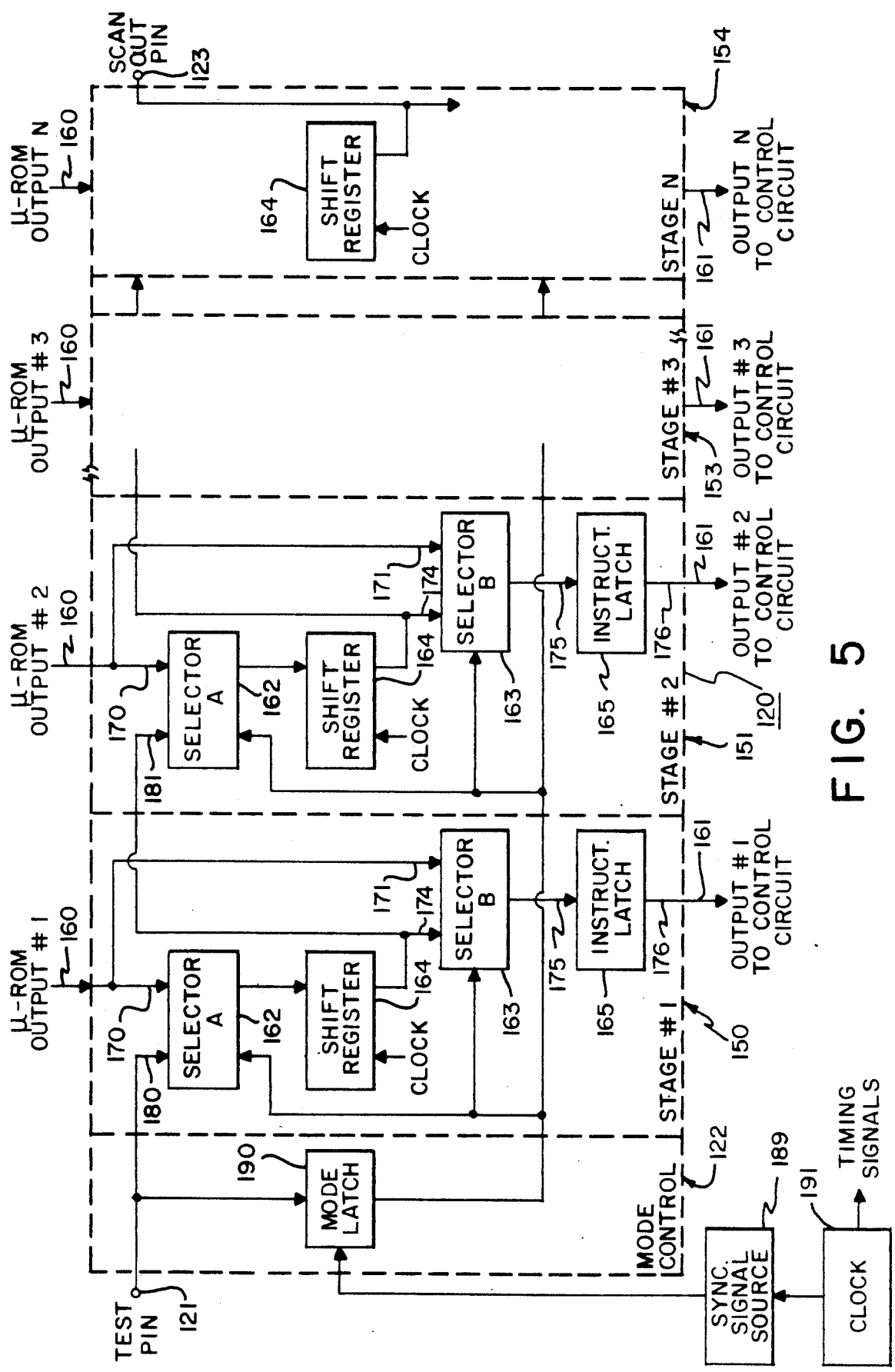
FIG. 5 is a more detailed block diagram of the test circuit in accordance with the invention.

Referring now to FIG. 5, the test circuit 120 is illustrated as comprised of a plurality of preferably identical stages 150–154 (the number of such stages is of course variable and dependent, for example, on the number of outputs of the μ-ROM circuit). Each of the stages has a separate data input terminal 160 connected to a separate output of the μ-ROM circuit, and a separate output 161 connected to a separate input of the control circuit. In addition, each stage is comprised of a first two-input selector 162, a second two-input selector 163, a shift register 164 and an instruction latch 165. The data inputs 160 are each connected to one input 170 of the respective selector 162, and one input 171 of the respective selector 172. The output of the selectors 162 are connected to the inputs of the respective shift registers 164, and the outputs of the shift registers 164 are connected to the second inputs of the respective selector 163. The outputs of the selectors 163 are connected to the inputs 175 of the respective instruction latches, and the outputs 176 of the latches are connected to the respective stage outputs 160.

The other input 180 of the selector 162 of the first stage is connected to the test pin 121 via the TEST IN circuit, or mode control circuit 122. The other input 181 of the second stage, as well as the succeeding stages, is connected to the output of the shift register 164 of the next preceding stage. The output of the shift register of the last stage 154 is connected to the SCAN OUT pin 123.

The TEST IN circuit 122 further comprises a mode latch 190 connected to receive the signal input of the test pin, and to couple the output thereof to each of the selectors 162,163 of each of the stages, as a control or selection signal. The latch 190, for example a D type flip flop, is controlled by a periodic synchronization pulse from the signal source 189, in turn synchronized by the clock 191 of the system which provides the timing signals for the μ-ROM, test circuit, control circuit, etc. The latch provides an output signal of high logic level when the test pin logic level is high at the time of the synchronization pulse, and a signal of low logic level when the test pin is at a low logic level at the time of the synchronization pulse. A test signal generator (not illustrated) connected to the test pin, and synchronized with the clock and synchronization pulse, thereby can control the mode of operation of the test circuit. The output of the latch, coupled to the selectors 161, 162, determines the direction of signals through the test circuit.

In normal operation, the level of the signal at the test pin 121 enables the latch to control the selectors 161, 162 so that the selectors 161 pass the data signals at inputs 170 to the shift registers 164, and so that the selectors 163 pass the data signals at their inputs 171 directly to the instruction latches 165, and thence to the respective outputs 161. The test circuit hence does not modify the data signals at all in this mode. The instruction latches, which may be D type flip flops, serve as buffers to retain the data therein for a determined time, such as a clock period, in conventional manner. It should be noted that the shift registers 164 are not effective in data transmission at this time, since they are connected to inactive inputs of the selectors. They do retain the current data, however, which may be read out in a test mode, as will be seen. The shift registers may each have one or more shift register stages.

When the level at the test pin from the test generator (not shown) is changed to a different level, at the time of a synchronization pulse, to provide the test mode, the logic level of the output of the latch 190 controls the selectors 162, 163 to pass the signals at their other inputs. The data at test pin 121 is thus applied to the shift register 164 of the first stage 150, the output of this shiftd register being directed to the respective output 161 via the selector 165, as well as to the shift register 164 of the next stage via the selector 162 of the next stage. As a consequence, the data which had been stored in the shift registers prior to initiation of the test mode is stepped through the shift registers of the succeeding stages of the test circuit to the SCAN OUT pin 123, followed by serial test signals from the test generator.

The test mode may be initiated at any desired time during testing of the IC, of course in synchronism with the synchronization pulse, so the effect of test signals on the output of the μ-ROM may be determined in accordance with a suitable program of the test generator. Since the outputs of the shift registers 164 are also applied to the stage outputs 161 of the respective stage, by way of the selectors 163 and latches 165, the effect of the test signal on the control circuit may also be determined, since the outputs of the control circuit are fed back to the μ-ROM.

Figure 6:
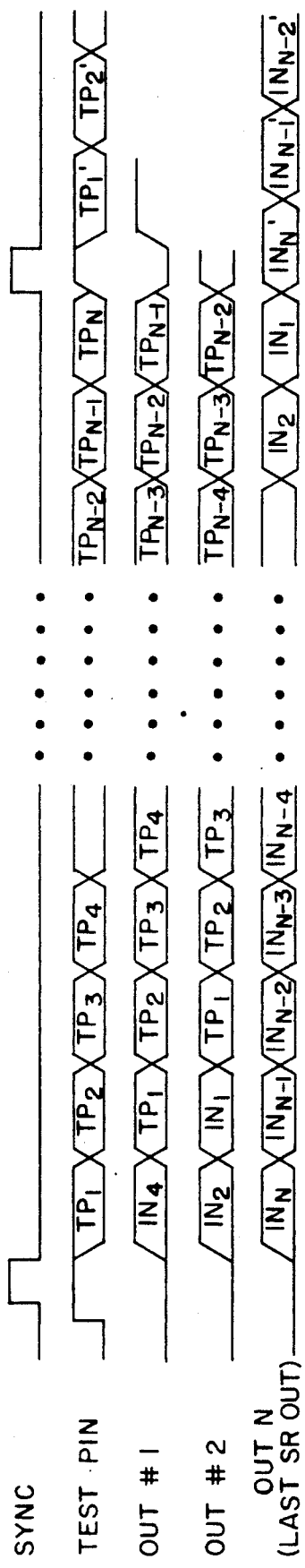
FIG. 6 is a time diagram for explaining the operation of the invention.

The stepping of the signals is more clearly illustrated in the time diagram of FIG. 6, wherein the first line of the diagram illustrates the synchronization pulse. The logic level at the test pin is illustrated in the second line of the diagram as being high at the time of a synchronization pulse, thereby initiating the test mode. In this diagram the signals applied to the test pin 121, following the synchronization pulse, are sequentially $TP_1'$ $TP_2'$ $TP_3'$ etc, the second line of the diagram thus illustrating the scan-in test pattern. The data signals stored in the shift registers of stages 150, 152, 153, etc. at the time the test mode was initiated are $IN_1'$ $IN_2'$ $IN_3'$ etc. It is thus apparent that upon initiation of the test mode, the outputs of the each of the stages initially corresponds to the last data applied to the respective stage, and that during successive cycles of operation, i.e. stepping of the shift registers, the IN signals are stepped through the outputs of the stages, followed by the serial inputs applied to the test pin. Thus, if the time between successive synchronization pulses is equal to (or greater than) the time for a signal to be stepped through all of the stages, the data output of the μ-ROM immediately prior to the initiation of the test mode may be read at the SCAN OUT pin, followed by the serial input test signals. The output signals applied to the SCAN OUT pin are thus illustrated in the last line of FIG. 6. The operation of the μ-ROM may thus be evaluated. These serial input test signals are also applied in parallel to the control circuit. Since outputs of the control circuit are applied to the μ-ROM circuit, the effect of these test signals may be determined in a later test cycle, when these signals have been processed in the μ-ROM and the result applied in parallel to the test circuit and stored in the shift registers.

Figure 7:
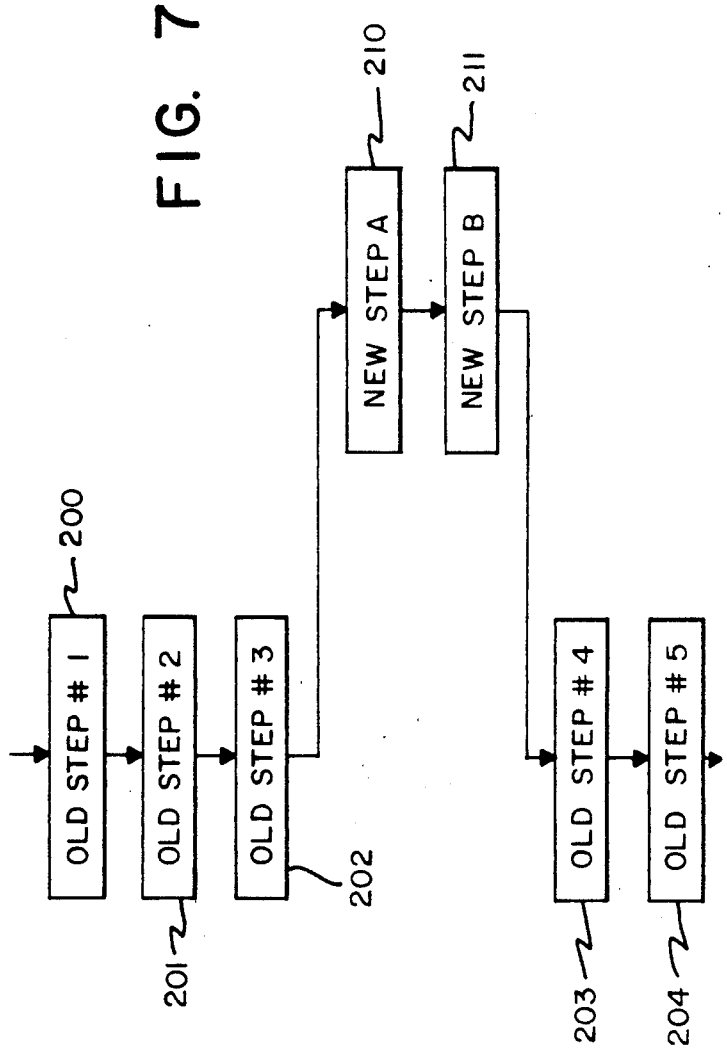
FIG. 7 is a flow diagram illustrating a further use of the arrangement of the invention.

In addition to enabling the quality control of IC circuits, the test arrangement of the invention is also adapted to simplify the task of development of IC circuits. Thus, the test circuit may be employed to add steps, and modify such added steps, in the development of program steps for an IC circuit. The test circuit may also in this case be fabricated on the same chip as the IC. As illustrated in FIG. 7, assume that an IC had been previously programmed to follow process steps 200-204 sequentially. In accordance with the invention, this sequence may be interrupted, for example between the steps 202 and 203, to interject additional steps 210 and 211 via the test input. These additional steps may of course be modified upon evaluation of the effects of the test signals, to improve the operation of the device, without the necessity of modification of the IC itself. When the additional steps are found to be satisfactory, they may be introduced into the programs of new chips. This technique thereby shortens the time for chip development, as well as rendering the procedure less expensive.

Figure 8:
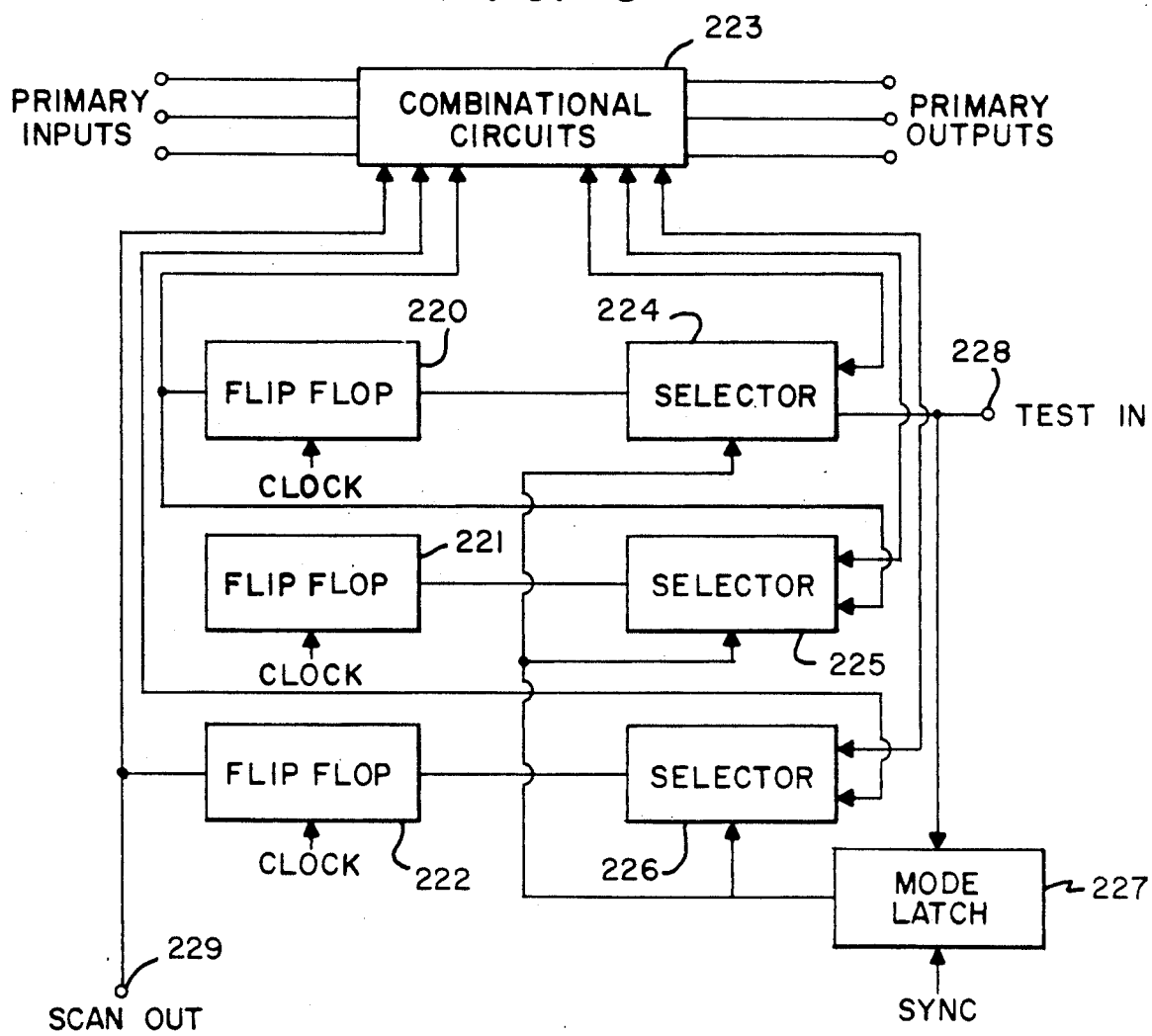
FIGS. 8, 9 and 10 are block diagrams of modifications of the system of the invention, showing the adaptation of the invention to other known systems.
Figure 10:
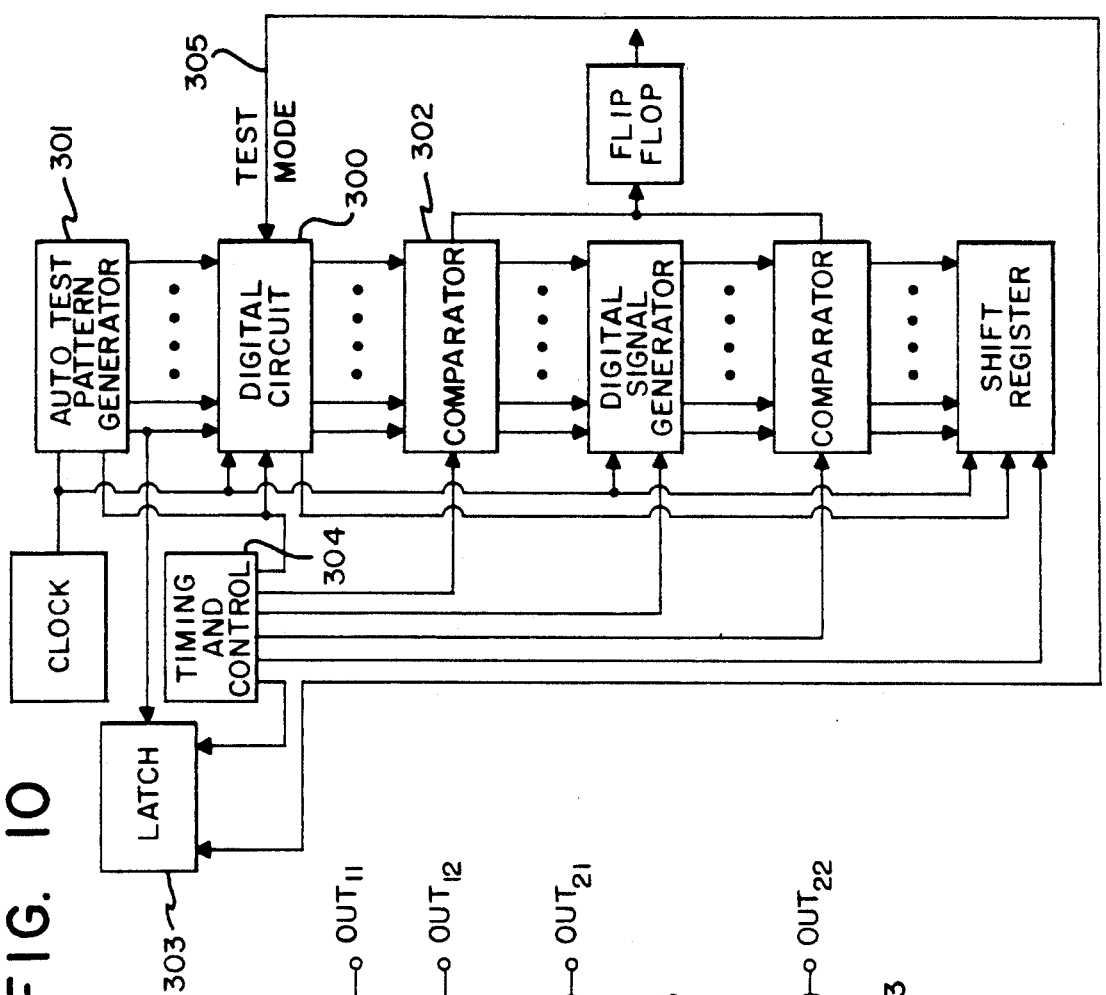
Figure 9:
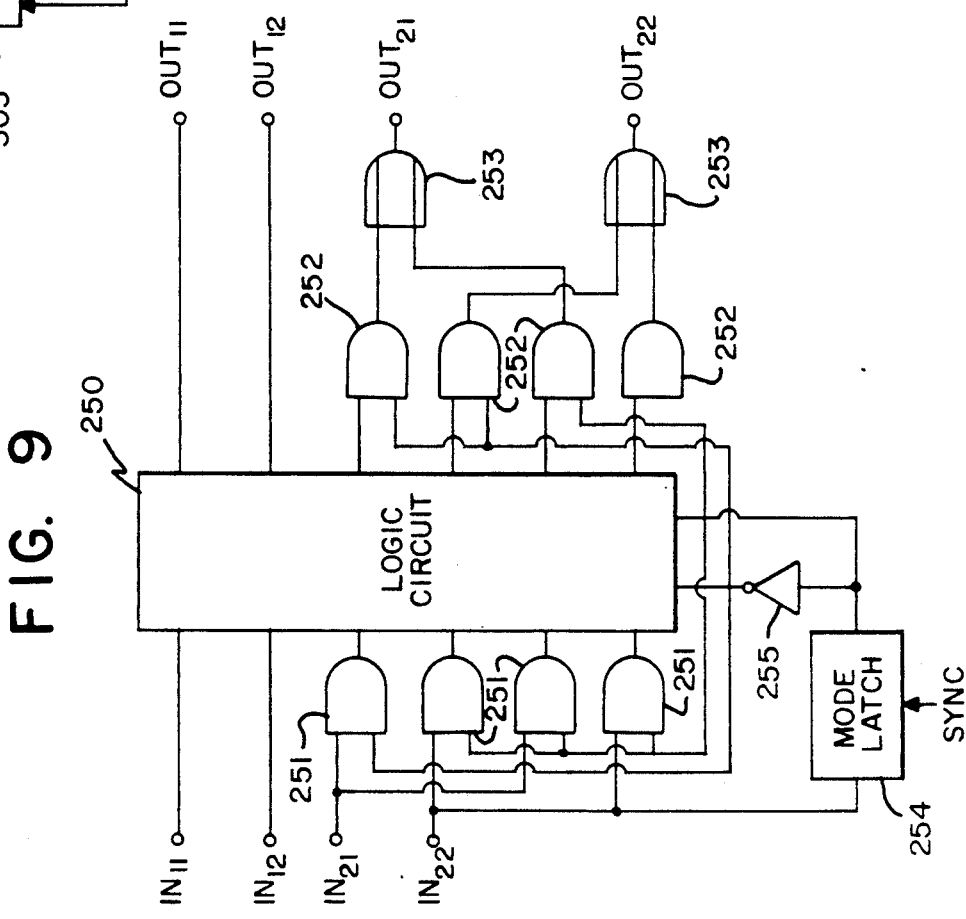

FIGS. 8-10 illustrate the use of the arrangement of the invention in combination with known systems. Thus, FIG. 8 illustrates a modification of the system of U.S. Pat. No. 4,493,077, wherein a plurality of storage elements, in the form of flip flop shift register circuits 220, 221, 222 are interconnected between inputs and outputs of a combinational circuit 223, by way of selectors 224, 225, 226. Signals normally pass from outputs of the combinational circuit via the selectors and the shift register circuits to inputs of the combinational circuit, generally in the manner illustrated in FIG. 3 of the present disclosure. The shift registers may here be clocked in any conventional manner. In accordance with the invention, the selectors are controlled by the mode output of the mode latch 227. Thus the test mode is initiated here by the coicidence of the synchronization pulse applied to the latch 227 and a determined level at the test pin 228. This effects the serial interconnection of the shift registers between the test pin and the scan out pin 229, to enable the read out of data previously stored in the shift registers, as well as the stepping of serial data at the test in pin 228 through the circuit.

The circuit of FIG. 9 is a modification of the system of U.S. Pat. No. 4,267,463, in accordance with the invention. Here the alternally selectable inputs IN A and IN B are connected to the logic circuit 250 via AND gates 251, and the alternative outputs OUT A and OUT B are connected to the logic circuit 250 via AND gates 252 and OR gates 253. The AND gates, serving as selectors, are controlled in accordance with the invention, by the output of mode latch 254. In this case, test signals applied to the input IN B, coinciding with the synchronization pulse applied to the latch, and applied directly and by way of invertor 255, effect a change in the operational mode of the system, so that in a normal mode the input IN A and the output OUT A are active, whereas in the test mode the input IN B and the output OUT B are active.

The circuit of FIG. 10 is a modification of the system of U.S. Pat. No. 4,534,028, in accordance with the invention. Here a test pattern is applied to the digital circuit 300 by the generator, the digital circuit having outputs connected to the comparator. In this circuit, in accordance with the invention, one of the outputs of the pattern generator 301 is applied as an input to the latch 303, for controlling the mode of operation of the system as a function of the level of this signal at the time of occurence of a synchronization pulse from the timing and control circuit 304. The output of the latch circuit is applied, as a mode control signal, to the mode input 305 of the digital circuit. The output of the generator 301 directed to the latch also applies signals to the digital circuit which, in accordance with the invention, may be a serial test pattern.

While the invention has been disclosed with reference to a limited number of embodiments, it will be apparent that modifications may be made therein within the scope of the invention, and it is therefore intended in the following claims to cover each such modification and variation as falls within the true spirit and scope of the invention.

What is claimed is:

1. A test circuit for an IC circuit, said test circuit comprising a test input terminal, a latch circuit having first and second output states, data inputting terminal means, signal outputting terminal means, a source of a synchronization signal, said test circuit comprising means for setting said latch circuit to said first and second output states in response to coincidence of said synchronization signal and the occurrence of first and second signal levels, respectively, at said test input terminal, said test circuit further comprising means responsive to said first state for directing signals from said inputting terminal means to said outputting terminal means, and means responsive to said second state for directing signals at said test input terminal to a scan output terminal.

2. The test circuit of claim 1 wherein said test circuit comprises a plurality of stages, said data inputting terminal means comprising a separate data input for each of said stages, said signal outputting terminal means comprising a separate data output for each of said stages.

3. The test circuit of claim 2 wherein each of said stages has first and second inputs, said first inputs comprising the data inputs of the respective stage, said test input comprising the second input of one of said stages, each of said stages comprising means responsive to said first and second states for directing signals at its first and second inputs respectively to the second input of a separate other one of said stages.

4. The test circuit of claim 3 wherein said means for directing signals at said first and second inputs comprises shift register means.

5. The test circuit of claim 4 wherein said stages are serially interconnected with respect to the outputs of said shift register means and the second inputs thereof, said outputting terminal means further comprising an output terminal connected to the output of the last of said stages.

6. The test circuit of claim 2 wherein each of said stages comprises first and second selectors each having first and second selector input terminals and an output selector terminal, means coupling each data input to the first selector inputs of the first and second selectors of the respective stage, means coupling the output selector terminal of the first selector to the second selector input terminal of the second selector of the respective stage, means coupling the selector output of the second selector to the data output of the respective stage, means coupling said test input terminal to the second selector input of the first selector of the respective stage, said means coupling the output selector terminal of the first selector of each stage comprising means coupling the output selector terminal thereof to the second selector input of the first selector of a separate other one of said stages.

7. The test circuit of claim 6 wherein said means responsive to said first and second states comprises means coupling the output of said latch circuit to said selectors as selection control signals.

8. In a test circuit for an IC circuit, said test circuit having a plurality of operating modes and comprising a test input terminal, a scan output terminal, a latch means having first and second output states, a source of a synchronization signal, and a plurality of stages each having a data input terminal and a data output terminal, said latch means comprising means responsive to coincidence of said synchronization signal and a signal of predetermined logic level at said test input terminal for changing the operating mode of said test circuit between a first mode in which signals at each data input terminal are directed to the output terminal of the respective stage, and a second mode wherein signals at said test input terminal are shifted to said scan output terminal.

9. The test circuit of claim 8 wherein each of said stages further comprises storage means for storing signals, whereby data applied to said data input terminals is stored in said storage means, said responsive means comprises means for shifting data from said storage means to said scan output terminal during said second mode.

* * * * *